United States Patent
Kellermann et al.

(10) Patent No.: US 10,651,513 B2
(45) Date of Patent: May 12, 2020

(54) STORAGE BATTERY ARRANGEMENT WITH IMPROVED CONDITION MONITORING

(71) Applicant: Bayerische Motoren Werke Aktiengesellschaft, Munich (DE)

(72) Inventors: Helmut Kellermann, Oberschleissheim (DE); Jan Philipp Schmidt, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 235 days.

(21) Appl. No.: 15/804,098

(22) Filed: Nov. 6, 2017

(65) Prior Publication Data
US 2018/0062211 A1 Mar. 1, 2018

Related U.S. Application Data

(63) Continuation of application No. PCT/EP2016/057590, filed on Apr. 7, 2016.

(30) Foreign Application Priority Data

May 7, 2015 (DE) .......................... 10 2015 208 464

(51) Int. Cl.
*H01M 4/02* (2006.01)
*H01M 10/42* (2006.01)
(Continued)

(52) U.S. Cl.
CPC .......... *H01M 10/4207* (2013.01); *B60L 3/12* (2013.01); *B60L 58/16* (2019.02); *B60L 58/22* (2019.02);
(Continued)

(58) Field of Classification Search
CPC ...................................................... H01M 8/04
See application file for complete search history.

(56) References Cited

U.S. PATENT DOCUMENTS

| | | | |
|---|---|---|---|
| 8,395,519 | B2 | 3/2013 | Cassidy |
| 2011/0031048 | A1 | 2/2011 | Ohkura |
| 2014/0125291 | A1 | 5/2014 | Hama et al. |

FOREIGN PATENT DOCUMENTS

| | | |
|---|---|---|
| AT | 510 877 A1 | 7/2012 |
| CN | 102479985 A | 5/2012 |

(Continued)

OTHER PUBLICATIONS

PCT/EP2016/057590, International Search Report dated Sep. 20, 2016 (Five (5) pages).

(Continued)

*Primary Examiner* — Jacob B Marks
(74) *Attorney, Agent, or Firm* — Crowell & Moring LLP

(57) ABSTRACT

A storage battery arrangement includes a plurality of storage battery cells connected in series, a central network node designed to transmit data using the storage battery cells and connected to the series connection of storage battery cells, a plurality of cell network nodes designed to transmit data using the storage battery cells, where each cell network node is connected in parallel to a storage battery cell. The storage battery arrangement also includes a control device designed to command at least one first cell network node to apply a test signal having at least one predetermined frequency to a first storage battery cell to which said first cell network node is connected, and to command a second cell network node connected to a second storage battery cell to determine, based on a signal response of the second storage battery cell to the test signal, at least one condition of the second storage battery cell.

14 Claims, 4 Drawing Sheets

(51) Int. Cl.
  *H01M 10/48* (2006.01)
  *B60L 3/12* (2006.01)
  *B60L 58/22* (2019.01)
  *G01R 31/396* (2019.01)
  *B60L 58/16* (2019.01)

(52) U.S. Cl.
  CPC ........ *G01R 31/396* (2019.01); *H01M 10/482* (2013.01); *H01M 10/486* (2013.01); *B60L 2240/545* (2013.01); *B60L 2240/547* (2013.01); *B60L 2240/549* (2013.01); *H01M 10/4264* (2013.01); *H01M 2010/4278* (2013.01); *H01M 2220/20* (2013.01)

(56) References Cited

FOREIGN PATENT DOCUMENTS

| | | |
|---|---|---|
| DE | 102 20 172 A1 | 11/2003 |
| DE | 10 2011 053 701 A1 | 5/2012 |
| DE | 10 2012 208 444 A1 | 11/2013 |
| DE | 10 2012 208 820 A1 | 11/2013 |
| DE | 11 2012 002 265 T5 | 3/2014 |
| DE | 10 2014 116 986 A1 | 5/2015 |
| JP | 2014-169966 * | 9/2014 |
| JP | 2014-169966 A | 9/2014 |
| WO | WO 2009/024355 A1 | 2/2009 |
| WO | WO 2011/095355 A2 | 8/2011 |

OTHER PUBLICATIONS

German Search Report issued in German counterpart application No. 10 2015 208 464.7 dated Feb. 25, 2016 (Six (6) pages).

Peter Keil el al., "Aufbau und Parametrierung von Batteriemodellen", 19. Design&Elektronik-Entwicklerforum Batterien & Ladekonzepte, Feb. 16, 2012, 12 total pages, XP055275939, URL:https://mediatum.ub.tum.de/doc/1162416/1162416.pdf.

Chinese Office Action issued in Chinese counterpart application No. 201680010658.8 dated Dec. 25, 2018, with English translation (Seventeen (17) pages).

* cited by examiner

STORAGE BATTERY ARRANGEMENT WITH IMPROVED CONDITION MONITORING

CROSS REFERENCE TO RELATED APPLICATIONS

This application is a continuation of PCT International Application No. PCT/EP2016/057590, filed Apr. 7, 2016, which claims priority under 35 U.S.C. § 119 from German Patent Application No. 10 2015 208 464.7, filed May 7, 2015, the entire disclosures of which are herein expressly incorporated by reference.

BACKGROUND AND SUMMARY OF THE INVENTION

The present invention relates to a storage battery arrangement which can be better monitored, in particular a storage battery arrangement for an electrically driven vehicle.

Storage battery arrangements having a plurality of cells connected in series and/or in parallel are used in electrically driven vehicles, for example a purely electrical drive or a so-called hybrid drive which comprises both an internal combustion engine and an electric motor. The cells may be combined to form modules. It is also possible to use two storage battery arrangements each having a plurality of cells connected in series. The storage battery cells may be so-called lithium ion batteries. During operation, that is to say during charging or discharging, the state of the storage battery cells must be monitored. For example, the state of charge of the cells must be permanently monitored. For this purpose, a separate electronic monitoring device is provided for each cell. Each electronic monitoring device is connected to a central battery monitoring device, for example by means of a CAN bus. A technical challenge in this case is the high voltage difference of several 100 V from the first storage battery cell to the last storage battery cell. Consequently, complicated insulation must be provided on the CAN bus and on the central battery monitoring device.

DE 11 2012 002 265 T5 discloses an impedance analysis in connection with a solid-state secondary battery.

WO 2009/024355 A1 discloses a method for determining impedance spectra for a location-selective representation of the capacitance distribution, resistance distribution and energy density distribution in a storage battery.

An object of the invention is providing an improved storage battery arrangement and an improved method for determining the state of a storage battery cell which does not require any complicated insulation.

A storage battery arrangement according to the invention comprises a plurality of storage battery cells connected in series and/or in parallel, a central network node, a plurality of cell network nodes and a control device. The central network node is designed to transmit data by means of the storage battery cells. The central network node is connected to the series circuit of storage battery cells, for example in a manner free of a reference potential by means of at least one coupling capacitor. Each of the plurality of cell network nodes is designed to transmit data by means of the storage battery cells. Each cell network node is connected in parallel with a storage battery cell. The control device is designed to instruct at least one cell network node to apply a test signal at at least one predetermined frequency to a first storage battery cell to which the first cell network node is connected, and to instruct a second cell network node which is connected to a second storage battery cell to determine at least one state of the second storage battery cell on the basis of the signal response of the second storage battery cell to the test signal.

The central network node and the plurality of cell network nodes form a network which transmits data by means of an energy supply line and a plurality of storage battery cells. Such data transmission via the power supply system is referred to as Power Line Communication (PLC) in energy engineering.

The test signal may have a predetermined frequency. This makes it possible to determine the resistances and capacitances in the storage battery cell. For example, a storage battery cell expands during charging, as a result of which the frequency response changes. The predetermined frequency may be in a range of approximately 1 MHz to approximately 30 MHz.

The invention has the advantage that it is possible to dispense with an additional bus and insulation of the bus as a result of the fact that data are transmitted by means of the storage battery cells and the lines connecting the storage battery cells. This makes it possible to reduce the effort needed to produce the storage battery arrangement and to maintain it.

The test signal may be a signal from an impedance analysis and/or a signal from a frequency response analysis. The impedance analysis and/or the frequency response analysis may use the carrier frequencies of a transmission method which uses a plurality of different carrier frequencies. The transmission method may be an OFDM (Orthogonal Frequency Divisional Modulation) method.

The cell network node may use, as the test signal, a signal which is used to determine the bandwidth of a transmission channel in the case of a plurality of potential carrier frequencies. This has the advantage that means and algorithms which are already present can be concomitantly used to determine the state of a storage battery cell even though these means were originally provided for the purpose of checking the bandwidth of a transmission channel. Such a method is referred to as "channel sounding" in the field of PLC.

The cell network node and/or the control device may be designed to determine at least the state of charge of the storage battery cell, the aging of the storage battery cell, the internal resistance of the storage battery cell, the temperature of the storage battery cell, and/or the mechanical stress acting on the storage battery cell by means of the test signal. The state of charge, the aging, the internal resistance, the temperature and the mechanical stress acting on the storage battery cell change the frequency response. These states can therefore be determined by means of a test signal which preferably has a plurality of predetermined frequencies. The cell network node may be designed to check the attenuation of the test signal and the signal-to-noise ratio at predetermined frequencies if the test signal is applied to the storage battery cell.

The invention also relates to a motor vehicle having the storage battery arrangement described above.

The invention also relates to a method for determining the state of a storage battery cell of a storage battery arrangement having a series circuit and/or a parallel circuit of a plurality of storage battery cells, a cell network node being connected in parallel with each of the storage battery cells. The method transmits an instruction signal by means of at least one first storage battery cell, with which a first network node is connected in parallel, from a central network node to a second network node which is connected in parallel with a second storage battery cell. A test signal at at least one predetermined frequency is applied to the first storage battery cell by means of the first cell network node if the instruction signal is received. A state of the second storage battery cell is determined on the basis of the signal response of the second storage battery cell to the test signal if the instruction signal is received.

The method can be developed in the manner described above with respect to the storage battery arrangement. The method can also check the states of the storage battery cell which were described above with reference to the storage battery arrangement.

The test signal may be a signal from an impedance analysis, a signal from a frequency response analysis, a signal which corresponds to the carrier frequencies of a transmission method having a plurality of different carrier frequencies, and/or a signal which corresponds to the carrier frequencies of an OFDM method.

The method may determine the attenuation of the test signal at a predetermined frequency. Alternatively or additionally, the method may determine the signal-to-noise ratio at a predetermined frequency.

The invention also discloses a computer program product which carries out the method described above when it is loaded into the memory of a computer having a processor.

Other objects, advantages and novel features of the present invention will become apparent from the following detailed description of one or more preferred embodiments when considered in conjunction with the accompanying drawings.

BRIEF DESCRIPTION OF THE DRAWINGS

The invention is now described in more detail with reference to the accompanying and non-restrictive figures, in which.

DETAILED DESCRIPTION OF THE DRAWINGS

Figure 1:
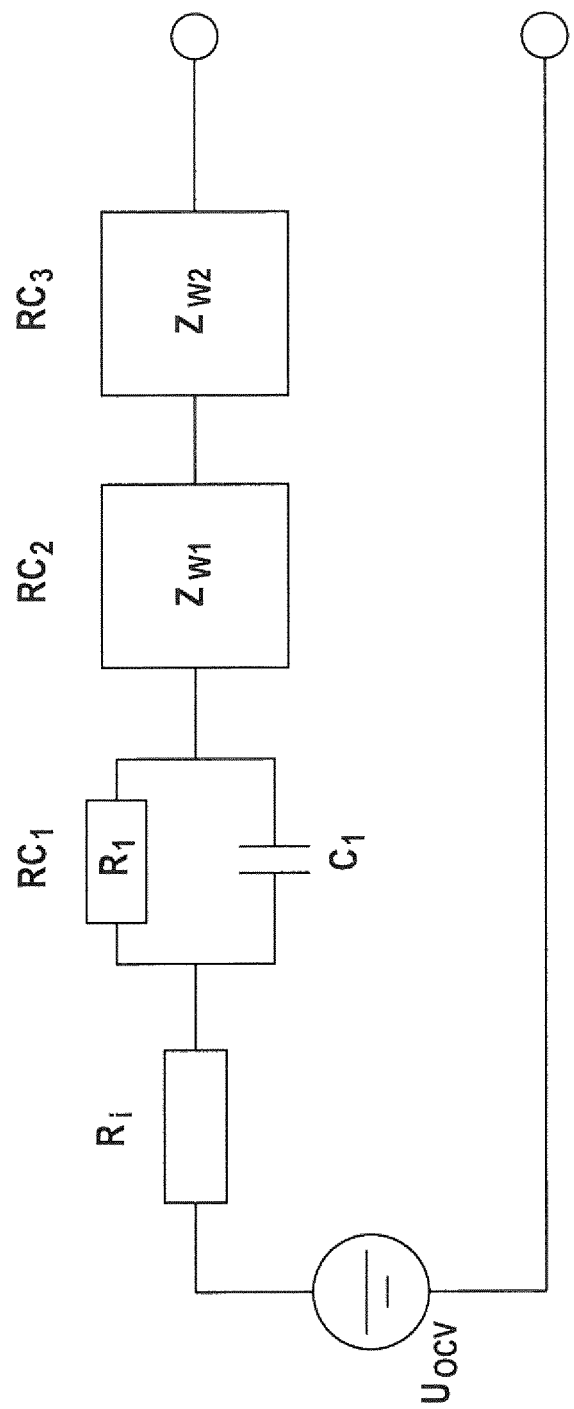
FIG. 1 shows an equivalent circuit diagram of a storage battery cell.

An equivalent circuit of a lithium ion battery cell, which has been gathered from the publication "Construction and parameterization of battery models", Peter Keil, Andreas Jossen, Technical University of Munich, Arcisstr. 21, 80333 Munich, chair of electrical energy storage technology, is described with reference to FIG. 1. The voltage source is modeled using UOCV. Ri corresponds to the internal resistance of the storage battery cell 100. The first RC element RC1 simulates the arcuate impedance spectrum of a lithium ion cell at a low frequency. The second RC element RC2 is a so-called Warburg impedance which simulates an ideal reservoir and also the arcuate impedance spectrum at a low frequency. The third RC element RC3 is likewise a Warburg impedance which simulates the impedance spectrum at higher frequencies. The values of the elements in the equivalent circuit change on the basis of the temperature, the state of charge and the current intensity, the relationships fundamentally being non-linear. With regard to further details, reference is again made to the publication "Construction and parameterization of battery models", Peter Keil, Andreas Jossen, Technical University of Munich, Arcisstr. 21, 80333 Munich, chair of electrical energy storage technology, the content of which is hereby included by reference.

Figure 2A:
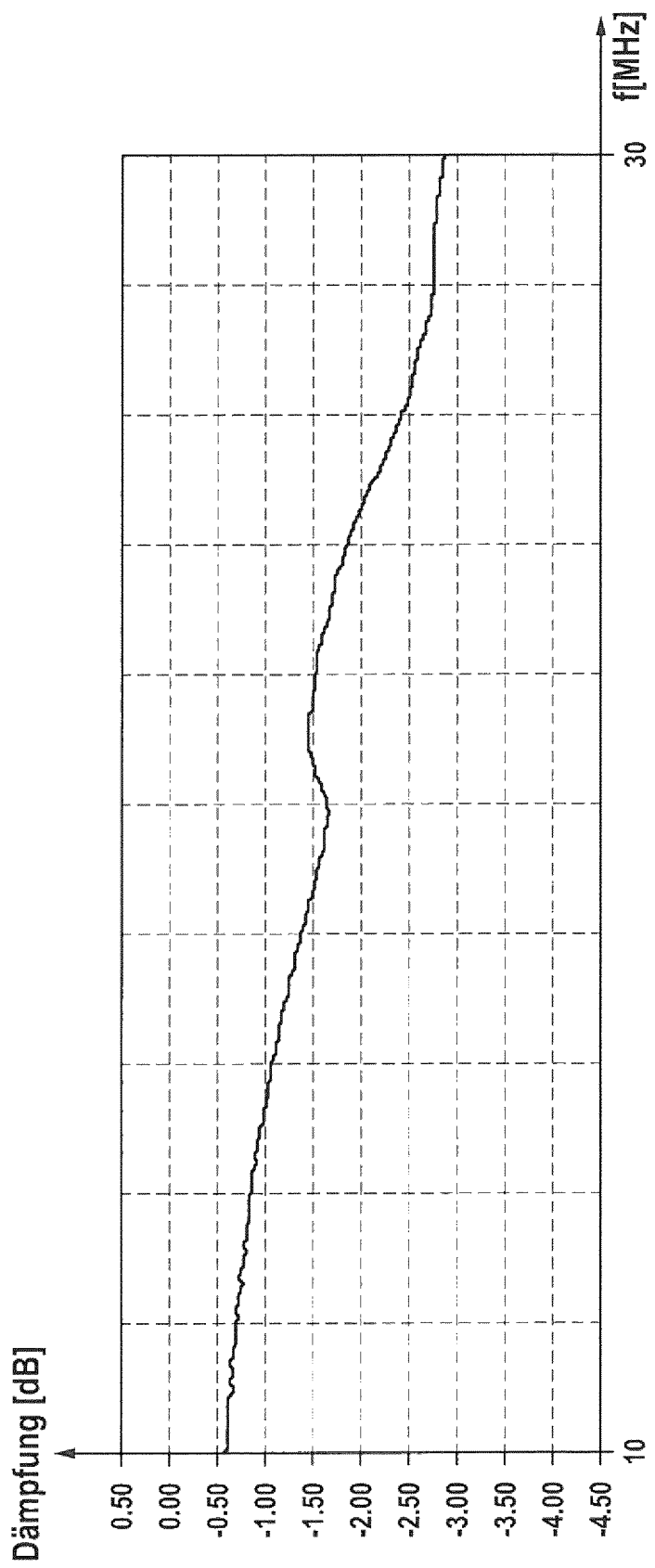
FIG. 2a shows the frequency response and FIG. 2b shows the phase response of a storage battery cell.
Figure 2B:
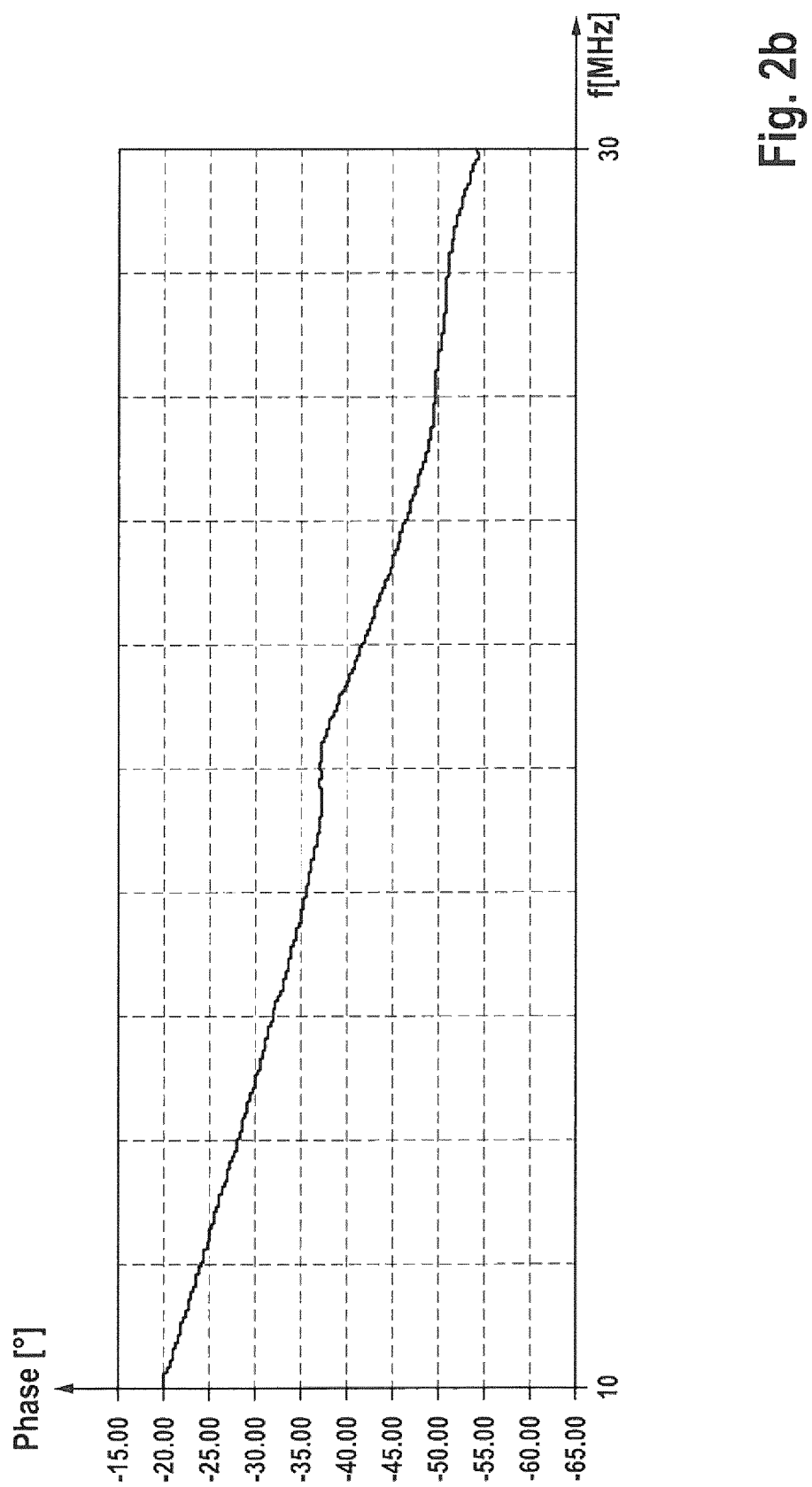

FIG. 2a shows the frequency response of a lithium ion cell in the range of 10 MHz to 30 MHz and FIG. 2b shows the phase response of a lithium ion cell at a frequency of 10 MHz to 30 MHz.

Figure 3:
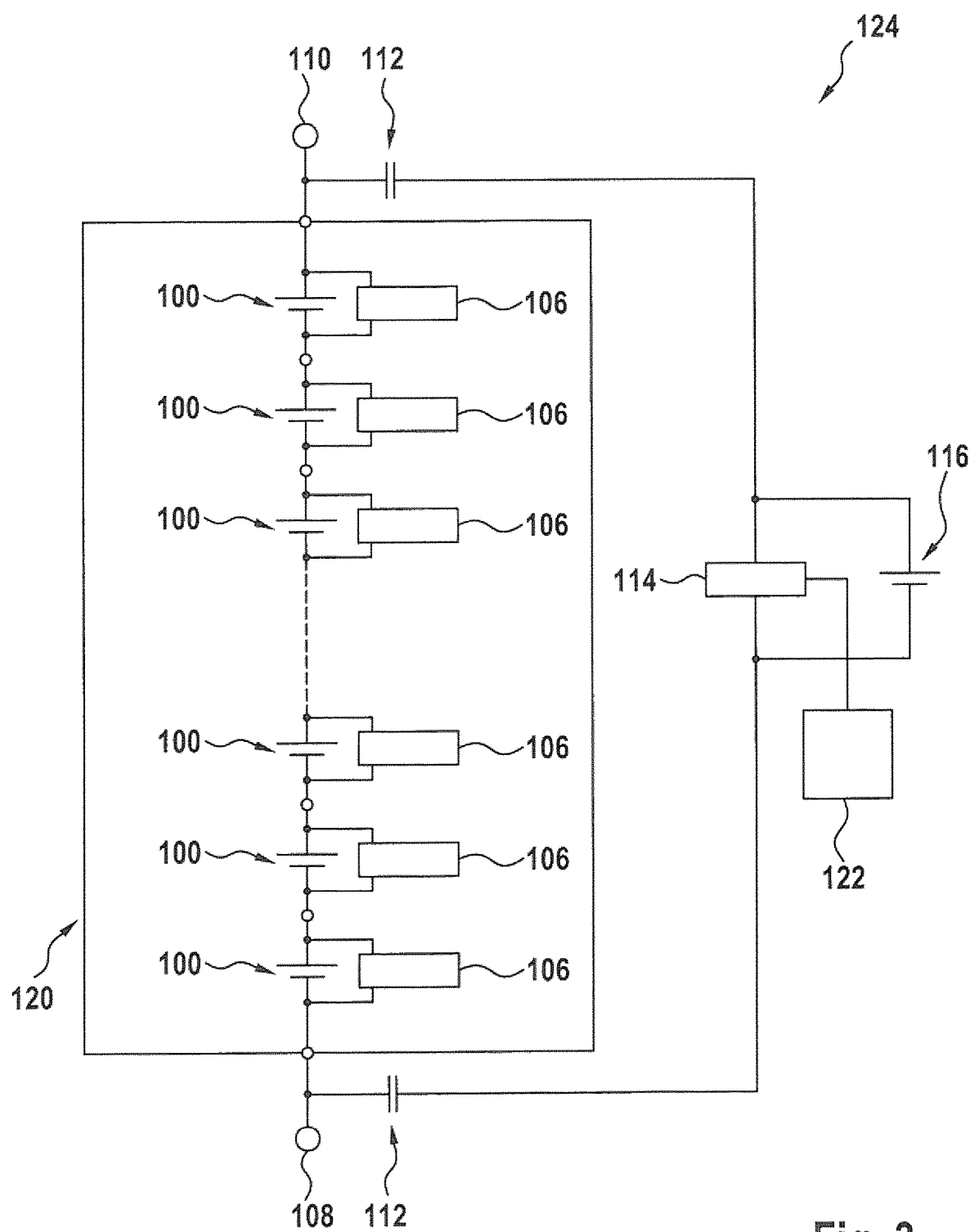
FIG. 3 shows a circuit diagram of the storage battery arrangement according to the invention.

FIG. 3 shows a storage battery arrangement 122 having a storage battery 120 and a control device 122 and a central network node 114. The storage battery 120 comprises a plurality of storage battery cells 100 connected in series. A series circuit of a plurality of storage battery cells 100 may be combined to form a module. Modules may be connected in series and/or in parallel.

A cell network node 106 is connected in parallel with each storage battery cell 100. The storage battery comprises a negative connection 108 and a positive connection 110. The central network node 114 is coupled to the series circuit of storage battery cells 100 via coupling capacitors 112. A high voltage is not applied to the central network node 114 since the central network node 114 is capacitively coupled to the series circuit of storage battery cells 100. No demanding insulation therefore needs to be provided in the region of the central network node 114 and the control device 122. The central network node 114 and the control device 122 are supplied by a battery 116, for example a conventional automobile battery.

The central network node 114 can communicate with the cell network nodes 106, the communication signal being transmitted by means of the storage battery cells 100 and the supply lines to the cell network nodes 106. OFDM (Orthogonal Frequency Divisional Multiplex) is used as the transmission method. The central network node 114 outputs a test signal which passes through the series circuit of all storage battery cells 100 in order to find suitable channels for communicating with the cell network nodes 106. This method is referred to as "channel sounding" in the technical jargon.

After the central network node 114 has determined suitable transmission channels, the central network node 114 can communicate with the cell network nodes 106 and vice versa. The control device 122 can instruct, via the central network node 114, a first cell network node 106 to check the state of a second storage battery cell 100 which is connected in parallel with a second cell network node 106. For this purpose, the cell network node 106 uses the test signal which is also used to determine the suitable OFDM channels between the first and second cell network nodes 100. The test signal comprises a spectrum of approximately 1 MHz to approximately 30 MHz. The attenuation and the signal-to-noise ratio are determined inside this spectrum. On the basis of the determined frequency response and the determined signal-to-noise ratio, the second cell network node 106 or the control device 122 can determine the values of individual network elements in the equivalent circuit on the basis of the equivalent circuit diagram of a storage battery cell 100, as described with reference to FIG. 1. Consequently, the cell network node 106 or the control device 122 can determine the state of charge of the storage battery cell, the aging of the storage battery cell, the internal resistance of the storage battery cell, the temperature of the storage battery cell and/or the mechanical stress acting on the storage battery cell.

The present invention has the advantage that the apparatuses and the elements for determining the state of a storage battery arrangement do not have to be insulated in a complicated manner. The present invention also has the advantage that a complicated sensor system is not needed to monitor the state of a storage battery cell and standard components can be used.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A storage battery arrangement having
a plurality of storage battery cells connected in a series circuit comprising at least a first storage battery cell and a second storage battery cell;
a central network node configured to transmit data using the plurality of storage battery cells, and which is connected to the series circuit of the plurality of storage battery cells;
a plurality of cell network nodes having at least a first cell network node and a second cell network node, the plurality of cell network nodes being configured to transmit data using the plurality of storage battery cells, wherein each of the plurality of cell network nodes is connected in parallel with a corresponding storage battery cell of the plurality of storage battery cells; and
a control device configured to:
instruct at least the first cell network node to apply a test signal at at least one predetermined frequency to the first storage battery cell to which the first cell network node is connected, which test signal passes through the series circuit of the plurality of storage battery cells, and
instruct the second cell network node, which is connected to the second storage battery cell, to determine at least one state of the second storage battery cell on the basis of a signal response of the second storage battery cell to the test signal.

2. The storage battery arrangement as claimed in claim 1, wherein the test signal is at least one of a signal from an impedance analysis and a signal from a frequency response analysis.

3. The storage battery arrangement as claimed in claim 2, wherein the at least one of the impedance analysis and frequency response analysis is carried out with carrier frequencies of a transmission method which uses a plurality of carrier frequencies.

4. The storage battery arrangement as claimed in claim 3, wherein the transmission method is an OFDM method.

5. The storage battery arrangement as claimed in claim 1, wherein at least one of a cell network node and the control device are configured to determine at least one of the following states using the test signal:
a state of charge of a storage battery cell of the plurality of storage battery cells;
an aging of the storage battery cell;
an internal resistance of the storage battery cell;
a temperature of the storage battery cell;
a mechanical stress acting on the storage battery cell.

6. The storage battery arrangement as claimed in claim 3, wherein at least one of a cell network node and the control device are configured to determine at least one of the following states using the test signal:
a state of charge of a storage battery cell of the plurality of storage battery cells;
an aging of the storage battery cell;
an internal resistance of the storage battery cell;
a temperature of the storage battery cell;
a mechanical stress acting on the storage battery cell.

7. The storage battery arrangement as claimed in claim 1, wherein a cell network node, of the plurality of cell network nodes, is configured to check an attenuation of the test signal and a signal-to-noise ratio at predetermined frequencies if the test signal is applied to a storage battery cell of the plurality of storage battery cells.

8. The storage battery arrangement as claimed in claim 3, wherein a cell network node, of the plurality of cell network nodes, is configured to check an attenuation of the test signal and a signal-to-noise ratio at predetermined frequencies if the test signal is applied to a storage battery cell of the plurality of storage battery cells.

9. The storage battery arrangement as claimed in claim 5, wherein the cell network node is configured to check an attenuation of the test signal and a signal-to-noise ratio at predetermined frequencies if the test signal is applied to the storage battery cell.

10. A motor vehicle having a storage battery arrangement, wherein the storage battery arrangement comprises:
a plurality of storage battery cells connected in a series circuit comprising at least a first storage battery cell and a second storage battery cell;
a central network node configured to transmit data using the plurality of storage battery cells, and which is connected to the series circuit of the plurality of storage battery cells;
a plurality of cell network nodes having at least a first cell network node and a second cell network node, the plurality of cell network nodes being configured to transmit data using the plurality of storage battery cells, wherein each of the plurality of cell network nodes is connected in parallel with a corresponding storage battery cell of the plurality of storage battery cells; and
a control device configured to:
instruct at least the first cell network node to apply a test signal at least one predetermined frequency to the first storage battery cell to which the first cell network node is connected, which test signal passes through the series circuit of the plurality of storage battery cells, and
instruct the second cell network node, which is connected to the second storage battery cell, to determine at least one state of the second storage battery cell on the basis of a signal response of the second storage battery cell to the test signal.

11. A method for determining the state of a storage battery cell of a storage battery arrangement having a plurality of storage battery cells connected in a series circuit and having a plurality of cell network nodes, including a first and a second cell network node, each of which is connected in parallel with a corresponding one of the plurality of storage battery cells, wherein the method comprises:
transmitting an instruction signal using at least a first storage battery cell of the plurality of storage battery cells, with which the first cell network node is connected in parallel, from a central network node to the second cell network node which is connected in parallel with a second storage battery cell of the plurality of storage battery cells;
applying a test signal at least one predetermined frequency to the first storage battery cell using the first cell network node if the instruction signal is received, which test signal passes through the series circuit of the plurality of storage battery cells; and determining at least one state of the second storage battery cell based on a signal response of the second storage battery cell to the test signal if the instruction signal is received.

12. The method as claimed in claim 11, wherein the test signal is at least one of the following:
   a signal from an impedance analysis;
   a signal from a frequency response analysis;
   a signal which corresponds to carrier frequencies of a transmission method having a plurality of carriers; and
   a signal which corresponds to carrier frequencies of an OFDM method.

13. The method as claimed in claim 11, further comprising at least one of:
   determining an attenuation of the test signal at a predetermined frequency;
   determining a signal-to-noise ratio at a predetermined frequency.

14. The method as claimed in claim 12, further comprising at least one of:
   determining an attenuation of the test signal at a predetermined frequency;
   determining a signal-to-noise ratio at a predetermined frequency.

* * * * *